United States Patent [19]

Fukushima et al.

[11] 4,319,341

[45] Mar. 9, 1982

[54] PROGRAMMING CIRCUIT FOR PERMANENTLY STORING DATA IN A PROGRAMMABLE READ ONLY MEMORY

[75] Inventors: Toshitaka Fukushima, Yokohama; Kazumi Koyama, Kanagawa; Kouji Ueno, Kawasaki; Tamio Miyamura, Kawasaki; Yuichi Kawabata, Kawasaki, all of Japan

[73] Assignee: Fujitsu Limited, Kawasaki, Japan

[21] Appl. No.: 141,933

[22] Filed: Apr. 21, 1980

[30] Foreign Application Priority Data

Apr. 25, 1979 [JP] Japan .................................. 54-51242

[51] Int. Cl.³ ........................ G11C 7/00; G11C 17/00
[52] U.S. Cl. ......................................... 365/94; 365/96
[58] Field of Search .................... 365/94, 96, 104, 105

[56] References Cited

U.S. PATENT DOCUMENTS

| | | | |
|---|---|---|---|
| 3,611,319 | 10/1971 | Hyatt | 365/96 |
| 4,101,974 | 7/1978 | Immer et al. | 365/96 |
| 4,130,889 | 12/1978 | Chua | 365/105 |

OTHER PUBLICATIONS

Radcliffe, "Fusable Diode Array Circuits", IBM Tech. Disc. Bul., vol. 21, No. 1, Jun. 1978, pp. 105-108.

*Primary Examiner*—Stuart N. Hecker

[57] ABSTRACT

A program circuit for permanently storing data into a programmable read only memory. A programming current (received from an external source) is connected to the selected bit line through a Darlington pair which is controlled by the bit decoding circuitry. Thus, the bit decoding circuitry is not required to pass the large programming current, and the programming current is not significantly shunted away from the selected bit line. To facilitate use of the Darlington configuration, a constant current source is provided for each bit line within a set of bit lines. The program circuit includes at least one switching means for connecting the program current to a selected bit line, a bit decoder connected to the control inputs of the switching means for selecting a bit line in response to the addressing signals input to the bit decoder and a control current supplying means for supplying a control current to the control inputs of the switching means.

6 Claims, 4 Drawing Figures

PROGRAMMING CIRCUIT FOR PERMANENTLY STORING DATA IN A PROGRAMMABLE READ ONLY MEMORY

BACKGROUND OF THE INVENTION (1) Field of the Invention

This invention relates to a program circuit for permanently storing data in a programmable read only memory (PROM) and, more particularly, to an improvement of a program circuit for a junction-shorting or fuse-blown type PROM.

(2) Description of the Prior Art

As widely known in the prior art, a junction-shorting type PROM includes a plurality of memory cells. Each memory cell is connected between a bit line and a word line. Each memory cell usually consists of two diodes connected in series and in reverse direction to each other. Data is stored in a memory cell by electrically shorting a junction in the two diodes of the cell. Instead of each memory cell consisting of two diodes, each memory cell may be a transistor having a base open structure. This transistor is electrically equivalent to the above-mentioned two diodes. In such a base open transistor, the junction between the emitter and the base is used as the junction to be shorted, and the junction between the base and the collector is used as a diode for isolation against reverse current flow.

In order to program such a PROM, a program circuit is generally used. The known program circuit includes at least one switching circuit whose program input receives a program current, whose control inputs are connected to outputs of a decoder for decoding bit addressing signals which are received, and whose outputs are connected to bit lines. When bit addressing signals are applied to the inputs of the decoder, each switching circuit causes the program current to be conducted through one of the bit lines in response to one output of the decoder. Then, when a word line is selected and its potential is lowered, junction shorting is effected in the memory cell connected between the specified bit line and word line. In this way, programming of the PROM is performed.

However, the program circuits of the prior art involve problems. That is, as hereinafter described in detail, since the programming current is conducted not only through the selected bit line but, also, through other circuit elements, the programming current is wasted in these circuit elements. In addition, because the characteristics of these circuit elements are not uniform, the programming current conducted through the selected bit line is not constant. This often results in an insufficient amount of current to effect junction shorting. If insufficient current is conducted through a selected bit line, the selected memory cell is subjected to a current which is relatively large, but which is not enough to effect junction shorting, for a relatively long time. The memory cell, when subjected to a relatively large current for a relatively long time, becomes overheated and, as a result, inoperative.

The above mentioned problems in the prior art have recently become more serious because of the necessity to lower programming power, in accordance with the trend toward miniaturization of each memory cell and the accompanying shallow junctions due to high integration of PROMs.

The fuse-blown type PROM of the prior art, in which information is stored by blowing a fuse connected between a bit line and a word line, also involves the above mentioned problems.

SUMMARY OF THE INVENTION

An object of the present invention is to provide a program circuit in which the reliability of programming is increased over that of the prior art.

Another object of the invention is to provide a program circuit in which the program power is reduced over that of the prior art.

Still another object of the invention is to provide a program circuit in which the program current is not conducted through undesired circuit elements.

According to the present invention, there is provided a program circuit, for permanently storing data in a programmable read only memory, including:

at least one switching means, each of which has a plurality of control inputs connected respectively to the outputs of a decoder, a program input to which program power is to be applied, and a plurality of outputs connected respectively to bit lines in said read only memory, wherein the program circuit further comprises a control current supplying means having an input and a plurality of outputs, each of the outputs being connected to one of the control inputs, whereby, when a control signal is applied to the input, the control current supplying means supplies control current to each of the control inputs, so that, when the program power is applied to the program input, the switching means connected to the program input causes a program current to be conducted through one of the bit lines.

BRIEF DESCRIPTION OF THE DRAWINGS

The above mentioned objects, and other objects and advantages, of this invention will be better understood from the detailed description of an embodiment set forth below with reference to the accompanying drawings, wherein.

DESCRIPTION OF THE PREFERRED EMBODIMENTS

Figure 1:
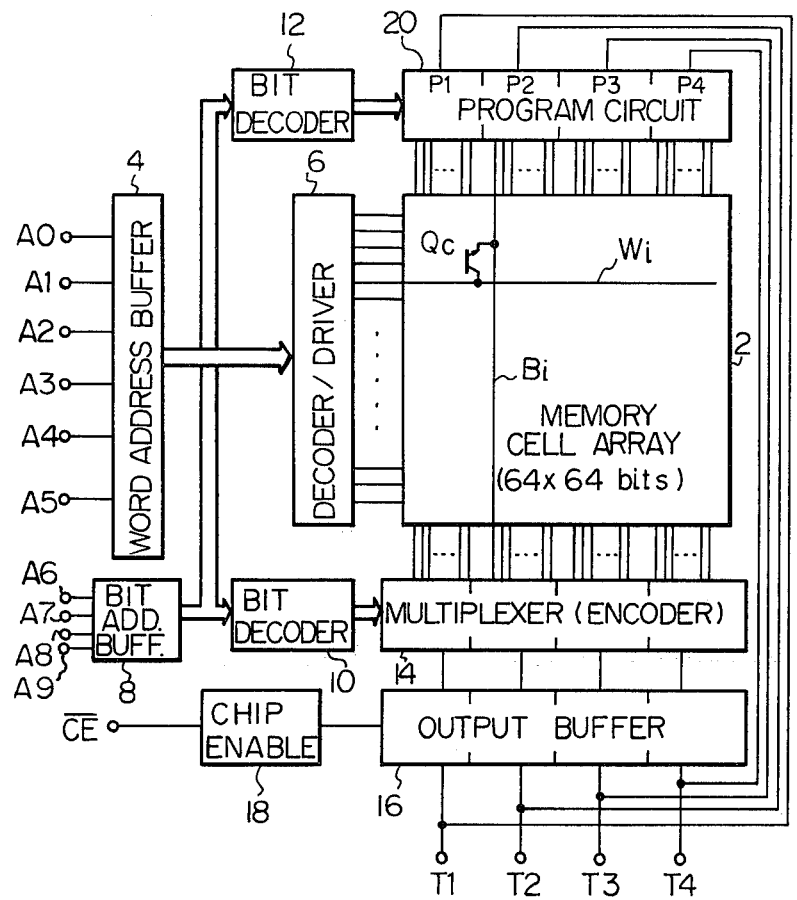
FIG. 1 illustrates a block diagram of a generally known 4k bit PROM system.

Referring to FIG. 1, a generally known 4k PROM system includes a memory cell array 2 having 64 bit lines $B_i$ and 64 word lines $W_j$. One base-open transistor $Q_c$, which is a memory cell, is connected between each of the 64 bit lines $B_i$ and each of the 64 word lines $W_j$. Thus, the number of memory cells included in this array is 4,096. Each bit line is connected, on the one hand, to one of the 64 program outputs of a program circuit 20 and, on the other hand, to one of the 64 inputs of a multiplexer (encoder) 14. The program circuit 20 consists of four switching circuits, each of which has one program input and sixteen program outputs. The multiplexer 14 consists of four switching circuits, each of which has sixteen read-out inputs and one read-out output. The multiplexer 14 and the program circuit 20 are connected through their respective control inputs to bit decoders 10 and 12, respectively. The bit decoders 10 and 12 are connected through a bit address buffer 8 to four bit addressing inputs A6 through A9. Six word addressing inputs A0 through A5 are connected through a word address buffer 4 to a decoder/driver 6. The decoder/driver 6 has 64 outputs, each of which is connected to one of the 64 word lines $W_j$. The four read-out outputs of the multiplexer 14 are connected to an output buffer 16, which has four outputs connected to four terminals T1 through T4 of this system. The output buffer 16 also has a control input connected through a chip enable unit 18 to a terminal CE for receiving a chip enable signal. The four output terminals T1 through T4 are also connected to the four program inputs P1 through P4 of the program circuit 20.

In operation, when data is to be permanently stored in desired memory cells, the chip enable signal is turned to high so that the output is in high impedance state. In this condition, word addressing signals specifying a desired word line are applied to the word addressing inputs A0 through A5, and bit addressing signals specifying a desired bit line are applied to the bit addressing inputs A6 through A9. At the same time, program power of, for example, 30 V and 200 mA, is applied to a desired one of terminals T1 through T4 of the system. The power applied, for example, to the terminal T1 is conducted through one of the four switching circuits to one of the sixteen bit lines connected to the switching circuit, selected in accordance with the outputs of the bit decoder 12. On the other hand, one of the 64 word lines is selected in accordance with the 64 outputs of the decoder/driver 6, so that the electric potential of the selected word line is lowered. Thus, a junction-shorting occurs in the connection between the emitter and the base of the memory cell connected between the selected bit line and the selected word line. The junction-shorted memory cells store, for example, the information "1," and the other memory cells which are not subjected to the junction shorting store the information "0."

When data is to be read from desired memory cells, a chip enable signal is applied to the terminal CE, so that the output buffer 16 is in an active state of high or low potential. In this case, the terminals T1 through T4 do not receive the program power, but are used only as output terminals for reading out data. Addressing of a desired memory cell in the reading out operation is performed in the same way as addressing in the programming operation described above. When the selected memory cell is a junction-shorted type, current will flow from the selected bit line $B_i$ through the selected memory cell to the selected word line. The current can be detected at one of the terminals T1 through T4.

Figure 2:
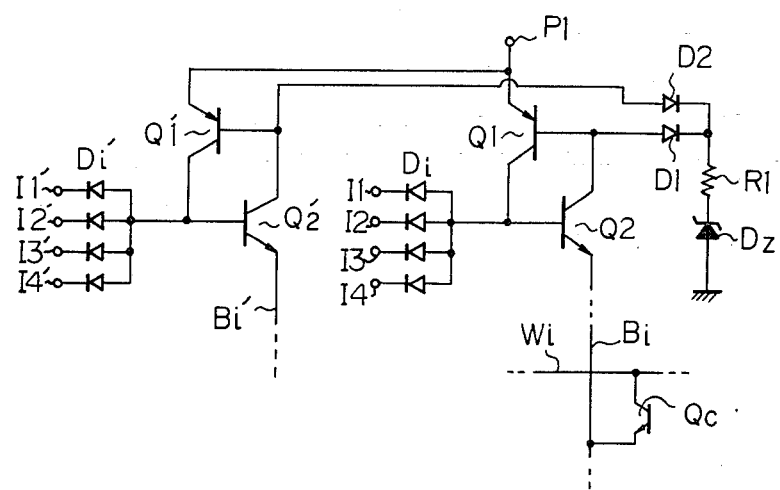
FIG. 2 is a circuit diagram of a part of the program circuit in the system of FIG. 1.

FIG. 2 is a circuit diagram illustrating a part of one of four switching circuits in the program circuit of FIG. 1. In FIG. 2, only two bit lines $B_i$ and $B_i'$ are connected to the emitters of the NPN transistors Q2 and Q2', respectively. However, in practice, sixteen bit lines are connected to respective emitters of sixteen NPN transistors. A voltage controlling circuit comprised of a resistor R1 and a zener diode $D_Z$ is connected through a diode D1 to the base of a PNP transistor Q1, and through a diode D2 to the base of a PNP transistor Q1'. Also, the voltage controlling circuit is commonly connected through respective diodes (not shown) to the other fourteen PNP transistors (not shown). FIG. 2 illustrates only two of the PNP transistors, in order to avoid redundancy.

The operation of the circuit of FIG. 2 will now be briefly explained. Program power is first applied to a program input P1 of the program circuit 20 (FIG. 1). The program power is relatively large in comparison with the power for reading out data and is, for example, 30 volts and 200 mA. The voltage is applied through a forward emitter-base junction of the transistor Q1 or Q1', the diode D1 or D2, and the resistor R1, to the zener diode $D_Z$. When the voltage reaches the zener voltage of the zener diode $D_Z$, the zener voltage being, for example, 14 V, current will flow through the emitter-base junction of the transistor Q1 or Q1', the diode D1 or D2, the resistor R1, and the zener diode $D_Z$. Then, the transistors Q1 and Q1' are turned on. When at least one of the four inputs I1 through I4 of the diode group $D_i$ has a low potential, the collector current of the transistor Q1 is conducted to the low potential inputs, so that the transistor Q2 is maintained in the off-state. Also, when at least one of the four inputs I1' through I4' of the diode group $D_i'$ has a low potential, the transistor Q2' is maintained in off-state. On the other hand, when the bit line $B_i$ is to be selected, all of the four inputs I1 through I4 of the diode group $D_i$ have a high potential. In this state, the collector current of the transistor Q1 is not conducted through the diode group $D_i$, but is conducted through the base-emitter junction of the transistor Q2. Thus, the transistor Q2 is turned on and the program current is supplied through the transistor Q2 to the bit line $B_i$. When the program current is conducted through the bit line $B_i$, a junction shorting occurs in an emitter-base junction of a transistor $Q_c$ connected between the bit line $B_i$ and the selected word line $W_j$. Thus, the information "1" is stored in the transistor $Q_c$.

However, the prior-art circuit of FIG. 2 involves problems. That is, when the bit line $B_i$ is selected, the program current is conducted not only through the transistor Q1 and the transistor Q2 to the bit line $B_i$, but also, through the diode D1, the resistor R1, and the zener diode $D_Z$, to ground, and, through the transistor Q1', to at least one of the diodes in the diode group $D_i'$, because of the low potential at the input of the one diode. When a bit line is selected in a switching circuit, there are one diode group $D_i$ connected to the selected bit line and fifteen diode groups $D_i'$ (in FIG. 2, only one diode group $D_i'$ is shown) connected to non-selected bit lines. Therefore, the program current is shunted to the fifteen diode groups $D_i$. In theory, in order to cause junction shorting in the selected transistor $Q_c$, a current of only 160 mA is required, but a current of about 200 mA is required in practice because the program current is shunted to the voltage controlling circuit and the non-selected diode groups $D_i'$. In addition, since the current amplification factors of the PNP transistors Q1 and Q1' cannot be made uniform in the manufacturing process, the program current applied to the selected bit line $B_i$ may often be insufficient to cause junction shorting in the transistor $Q_c$, even when a large current of about 200 mA is applied to the program input terminal P1. If such an insufficient current is applied to the transistor $Q_c$ for a relatively long time, the transistor $Q_c$ is overheated and becomes inoperative.

Figure 3:
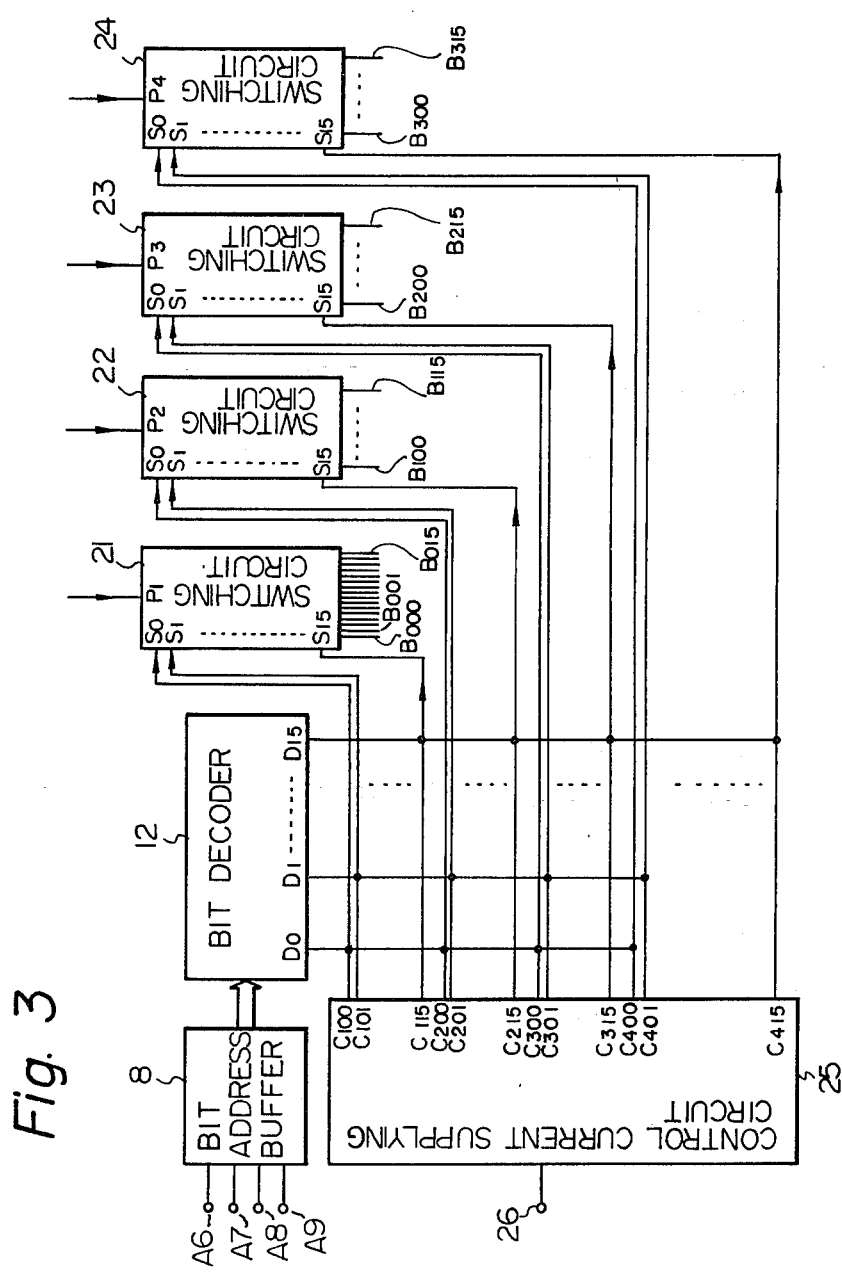
FIG. 3 is a block diagram of a program circuit for programming a 4k bit PROM, according to one embodiment of the present invention.

FIG. 3 is a block diagram of a program circuit for programming a 4-k bit PROM according to one embodiment of the present invention, in which the above mentioned problems have been obviated. In FIG. 3, the program circuit 20 includes four switching circuits 21 through 24. Each of the switching circuits has sixteen control inputs S0 through S15, one program input P1, P2, P3, or P4, and sixteen outputs connected to respective bit lines B000 through B015, B100 through B115, B200 through B215 or B300 through B315. The sixteen control inputs S0 through S15 of each switching circuit are connected respectively to sixteen inputs D0 through D15 of a bit decoder 12. Also the sixteen control inputs S0 through S15 of the first switching circuit 21 are connected respectively to the first sixteen outputs C100 through C115 of a control current supplying circuit 25. The other sixteen control inputs S0 through S15 of the second, third, and fourth switching circuits 22, 23, and 24 are also connected respectively to second, third, and fourth sets of sixteen outputs C200 through C215, C300 through C315, and C400 through C415, respectively.

In operation, bit addressing signals specifying one of the 16 bit lines are input to the bit addressing inputs A6 through A9 in the same way as in the prior art. The bit addressing signals are amplified and inverted by the bit address buffer 8. The amplified and inverted bit addressing signals are decoded by the bit decoder 12, so that the potential of one of the sixteen outputs D0 through D15 is increased to high level and, thus, that output does not accept or pull in any current. At the same time, according to the present invention, a control input current is supplied to the input 26 of the control current supplying circuit 25. The control current supplying circuit 25, when receiving the control input current at its input 26, supplies a constant current to its 64 outputs C100 through C115, C200 through C215, C300 through C315 and C400 through C415. In this condition, when a program power of, for example, 30 V and 160 mA, is supplied to at least one desired program input, for example, to the program input P1 of the switching circuit 21, the switching circuit 21 selects one of the sixteen outputs connected to the bit lines B000 through B015, depending on the outputs D0 through D15 of the bit decoder 12. Let it be assumed that the output D0, for example, does not pull in any current supplied to the output C100. Then, the other outputs D1 through D15 pull in currents from the outputs C101 through C115 of the control current supplying circuit 25. Thus, only the control current from the output C100 is supplied to the corresponding input S0 of the switching circuit 21. The other control currents from the outputs C101 through C115 are pulled in to the outputs D1 through D15 of the bit decoder 12 and, therefore, are not input to the inputs S1 through S15 of the switching circuit 21. Accordingly, the program power is applied to the bit line B000 without being shunted to the bit decoder 12. Also, when the output D1 of the bit decoder 12 does not pull in any current, the bit line B001 is selected. When the program current is supplied to the program input P2 of the second switching circuit 22, the bit line B100, B101, ..., or B115 is selected, depending on the selected outputs D0, D1, ..., or D15 of the bit decoder 12. When the program current is applied to the program input P3 of the third switching circuit 23 or to the program input P4 of the fourth switching circuit 24, one of the bit lines B200 through 215 or one of the bit lines B300 through B315 is selected, depending on the selected output D0, D1, ... , or D15 of the bit decoder 12.

Figure 4:
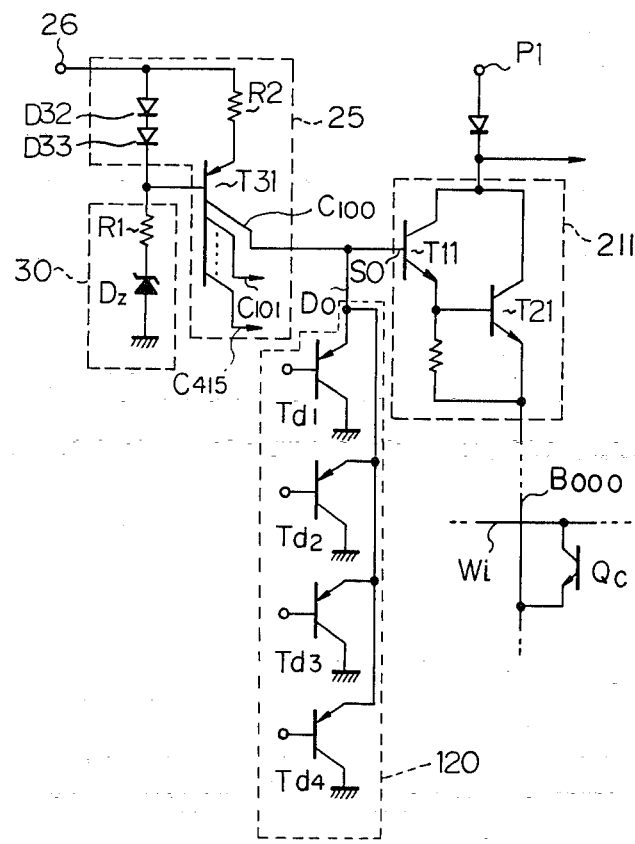
FIG. 4 is a circuit diagram of a part of the program circuit of FIG. 3.

FIG. 4 is a circuit diagram illustrating a part of the program circuit of FIG. 3. Each of the switching circuits 21 through 24 includes sixteen circuit units in practice. However, in FIG. 4, in order to avoid redundancy, only one circuit unit 211 of those included in the first switching circuit 21 (FIG. 3) is illustrated. The circuit unit 211 is comprised of two NPN transistors T11 and T21 in a Darlington connection. The base of the transistor T11 is the control input S0 of the switching circuit 21 (FIG. 3). The emitter of the transistor T21 is one of the sixteen outputs of the switching circuit 21 (FIG. 3), and is connected to the bit line B000. The control input S0 is connected to the output D0 of a decoder unit 120. The decoder unit 120 is one of sixteen decoder units (not shown) having the sixteen outputs D0 through D15 (FIG. 3), respectively. The decoder unit 120 comprises four PNP transistors Td1 through Td4. The control input S0 is also connected to the output C100 of the control current supplying circuit 25. The control current supplying circuit comprises a multi-collector PNP transistor T31 whose collectors are connected to the outputs C100 through C115, C200 through C215, C300 through C315 and C400 through C415. The emitter of the transistor T31 is connected through a resistor R2 to the input 26 of the control current supplying circuit 25. In order to supply a constant current to the output C100, C101, ..., or C415, two diodes D32 and D33, connected in series, are connected between the input 26 and the base of the multi-collector transistor T31, in such a way that the anode of the diode D32 is connected to the input 26 and the cathode of the diode D33 is connected to the base. Preferably, a voltage control circuit 30, comprising a resistor R1 and a zener diode $D_Z$ connected in series, is connected to the base of the transistor T31. The zener voltage of the zener diode $D_Z$ is preferably 14 V.

The operation of the circuit of FIG. 4 will now be explained. First, a control signal is applied to the input 26 of the control current supplying circuit 25 during programming of the memory cells. When the voltage of the control signal exceeds the zener voltage (14 V), current will flow through the diodes D32 and D33, the resistor R1 and the zener diode $D_Z$ to ground. Because the voltage drop across the diodes D32 and D33 is substantially constant and nearly equal to 1.6 V, a substantially constant current flows through the resistor R2 and the emitter of the transistor T31. Then, a substantially constant current flows through the collectors of the transistor T31. Therefore, the control current supplying circuit 25 supplies substantially constant current to its outputs C100, C101, ..., C415, independent of the loadings of these outputs.

When the bit addressing signals are decoded so that the output D0 of the decoder 12 (FIG. 3) does not pull in any current applied to the output D0, that is, when the output D0 has a high potential, the substantially constant current from the output C100 does not flow through the decoder unit 120. In this condition, when program power is applied to the program input P1, the transistor T11 and then the transistor T21 are turned on, so that a program current is conducted through the bit line B000. Thus, a junction shorting occurs in the emitter-base junction of the transistor $Q_c$ connected between the bit line B000 and the selected word line $W_i$. As a result, the information "1" is stored in the transistor $Q_c$.

It should be noted that, according to the present invention, the program current supplied to the program input P1 does not shunt to the decoder unit 120, control current supplying circuit 25, or voltage control circuit 30. Therefore, in order to conduct a current of 160 mA through the bit line B000, only 160 mA is required at the program input P1. In addition, since the program current flows only through the selected bit line, programming into the selected memory cell is ensured without undesirable heating of the cell. Therefore, the reliability of programming is greatly improved according to the invention over that of the prior art.

In the above described embodiment, the decoder unit 120 is comprised of four PNP transistors Td1 through Td4. However, the decoder unit may, of course, be comprised of four diodes as in the prior art. The advantage of employing PNP transistors in the decoder unit is that the current conducted through the address buffer 8 (FIG. 3) can be small, so that the size of each transistor in the address buffer 8 (FIG. 3) may be small. Therefore, by employing PNP transistors in the decoder unit, the integration degree and the operating speed of the address buffer are increased over those of the prior art.

If the voltage of the control signal applied to the input 26 of the control current supplying circuit 25 is below 14 V, current is not conducted through the zener diode $D_Z$ and, thus, the transistor T31 is kept in the off state. Therefore, programming can be controlled by controlling the voltage of the control signal applied to the input 26.

Preferably, the word address buffer 4, the bit address buffer 8 and the chip enable unit 18 (FIG. 1) are constructed by Schottky TTLs. In a Schottky TTL, the input transistor may be a PNP transistor which has a high input tolerance voltage of about 30 V. Therefore, even when the input 26 of the control current supplying circuit 25 is connected to other input, for example CE (FIG. 1), transistors in the chip enable unit 18 or the address buffers 4, 8 (FIG. 1) are not destroyed by the control signal.

Although the program circuit of the above described embodiment is applied to a junction-shorting type 4 K bit PROM, the program circuit of the present invention may, of course, be applied to other PROMs having more or less programming capacity or to a fuse-blown type PROM.

What is claimed is:

1. A program circuit for permanently storing data in a programmable read only memory, said program circuit including:
   a bit address decoder;
   at least one switching means comprising a plurality of control inputs connected respectively to the outputs of said decoder, a program input to which program power is to be applied, and a plurality of outputs connected respectively to the bit lines of the programmable read only memory, and
   control current supplying means having an input and a plurality of outputs, each of said outputs being connected to one of said control inputs of said switching means,
   wherein, when a control signal is applied to said input of said control current supplying means, control current is supplied to each of said control inputs, and
   wherein, when the program power is applied to said program input, said respective switching means connected to said program input causes the program power to flow through one of the bit lines.

2. A program circuit as claimed in claim 1, wherein said program circuit further comprises voltage control means for controlling the voltage of said input of said control current supplying means so that, when a voltage having a value greater than a predetermined value is applied to said input of said control current supplying means, said voltage control means drives said control current supplying means to supply control current to said control inputs.

3. A program circuit as claimed in claim 2, wherein said control current supplying means comprises a constant current source.

4. A program circuit as claimed in claim 1, wherein said control current supplying means comprises a multicollector PNP transistor.

5. A program circuit as claimed in claim 4, further comprising:
   diodes connected between said input and the base of said multicollector PNP transistor, and
   a resistor, connected between said input and the emitters of said multicollector PNP transistor, for providing a constant current.

6. A program circuit as claimed in claim 1, wherein each said switching means comprises a plurality of circuit units, each said circuit unit comprising two or more NPN transistors in a Darlington connection.

* * * * *

UNITED STATES PATENT AND TRADEMARK OFFICE
CERTIFICATE OF CORRECTION

PATENT NO. : 4,319,341

DATED : March 9, 1982

INVENTOR(S) : Fukushima et al.

It is certified that error appears in the above—identified patent and that said Letters Patent is hereby corrected as shown below:

Front page, after "Primary Examiner-Stuart N. Hecker" insert --Attorney, Agent, or Firm-Staas & Halsey--;

Col. 6, line 46, "loadings" should be --loading--.

Signed and Sealed this

Tenth Day of August 1982

[SEAL]

Attest:

Attesting Officer

GERALD J. MOSSINGHOFF

Commissioner of Patents and Trademarks